US012804882B2

(12) United States Patent
Jung et al.

(10) Patent No.: US 12,804,882 B2
(45) Date of Patent: Nov. 17, 2026

(54) SEMICONDUCTOR MEMORY DEVICE

(71) Applicant: SAMSUNG ELECTRONICS CO., LTD., Suwon-si (KR)

(72) Inventors: Haein Jung, Suwon-si (KR); Sungho Jang, Suwon-si (KR); Jiseok Kwon, Suwon-si (KR); Seung Hwan Kim, Suwon-si (KR); Seungho Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 387 days.

(21) Appl. No.: 18/462,553

(22) Filed: Sep. 7, 2023

(65) Prior Publication Data

US 2024/0306371 A1 Sep. 12, 2024

(30) Foreign Application Priority Data

Mar. 9, 2023 (KR) ........................ 10-2023-0031370

(51) Int. Cl.
*H10B 12/00* (2023.01)
*H10D 64/27* (2025.01)

(52) U.S. Cl.
CPC ........... *H10B 12/36* (2023.02); *H10B 12/315* (2023.02); *H10B 12/482* (2023.02); *H10B 12/485* (2023.02); *H10B 12/488* (2023.02)

(58) Field of Classification Search
CPC .... H10B 12/36; H10B 12/315; H10B 12/482; H10B 12/485; H10B 12/488; H10B 12/50; H10D 30/60; H10D 64/027; H10D 30/751; H10D 64/513
See application file for complete search history.

(56) References Cited

U.S. PATENT DOCUMENTS 7,012,007 B1 * 3/2006 Goo ..................... H10D 30/751 438/296
7,923,766 B2 4/2011 Saito
8,309,418 B2 11/2012 Guo et al.
8,487,367 B2 7/2013 Kellam
8,859,350 B2 10/2014 Zhang et al.
(Continued)

FOREIGN PATENT DOCUMENTS

CN 102148250 8/2011
CN 103972105 8/2014
(Continued)

OTHER PUBLICATIONS

Gluck, et al., "Design and fabrication of Si/SiGen-type MODFETs", in Elsevier Science B.V., 1998, 5 pages.

*Primary Examiner* — David Vu
(74) *Attorney, Agent, or Firm* — Morgan, Lewis & Bockius LLP

(57) ABSTRACT

A semiconductor device includes a semiconductor substrate including a first semiconductor material, a gate structure on the semiconductor substrate, and a semiconductor pattern including a second semiconductor material, between the semiconductor substrate and the gate structure. The semiconductor pattern is in contact with the semiconductor substrate, the gate structure passes through a portion of the semiconductor pattern, and is spaced apart from the semiconductor substrate, and the first semiconductor material is different from the second semiconductor material.

20 Claims, 11 Drawing Sheets

(56) References Cited

U.S. PATENT DOCUMENTS

| | | | | |
|---|---|---|---|---|
| 10,930,740 | B2 | 2/2021 | Jung et al. | |
| 2009/0310431 | A1 * | 12/2009 | Saito | H10B 12/20 365/207 |
| 2010/0255649 | A1 | 10/2010 | Lee et al. | |
| 2013/0228859 | A1 | 9/2013 | Jang | |
| 2017/0194494 | A1 | 7/2017 | Mayuzumi et al. | |
| 2018/0315663 | A1 | 11/2018 | Bao et al. | |
| 2019/0206870 | A1 | 7/2019 | Gao et al. | |

FOREIGN PATENT DOCUMENTS

| | | | |
|---|---|---|---|
| KR | 10-2011-0108887 | | 10/2011 |
| KR | 10-2020-0111582 | | 9/2020 |
| KR | 10-2022-0080293 | A | 6/2022 |
| WO | 2019032928 | | 2/2019 |

* cited by examiner

SEMICONDUCTOR MEMORY DEVICE

CROSS-REFERENCE TO RELATED APPLICATIONS

This application claims priority under 35 U.S.C. § 119 to Korean Patent Application No. 10-2023-0031370 filed on Mar. 9, 2023, in the Korean Intellectual Property Office, the disclosures of which are incorporated by reference herein in its entirety.

BACKGROUND

Embodiments of the present disclosure described herein relate to a semiconductor device.

A semiconductor device has been in the spotlight as an important factor in an electronic industry due to characteristics such as miniaturization, multi-functionalization, and/or low manufacturing cost. Semiconductor devices may be divided into semiconductor memory devices which store logical data, semiconductor logic devices which compute and process the logical data, and a hybrid semiconductor device which includes a memory element and a logical element.

Recently, with the high speed and low power consumption of an electronic device, a semiconductor device provided in the electronic device requires a rapid operating speed and/or a lower operating voltage, and a semiconductor device, which is more highly integrated is required, to satisfy the requirement. However, as the semiconductor device is more highly integrated, the reliability and electrical characteristics of the semiconductor device may be decreased. Accordingly, many studies and researches have been conducted to improve the reliability and electrical characteristic of the semiconductor device.

SUMMARY

Embodiments of the present disclosure provide a semiconductor device improved in reliability and an electrical characteristic.

The technical problems to be solved by the present disclosure are not limited to the aforementioned problems, and any other technical problems not mentioned herein will be clearly understood from the following description by those skilled in the art to which the present disclosure pertains.

According to an embodiment, a semiconductor device may include a semiconductor substrate including a first semiconductor material, a gate structure on the semiconductor substrate, and a semiconductor pattern including a second semiconductor material, between the semiconductor substrate and the gate structure. The semiconductor pattern is in contact with the semiconductor substrate, the gate structure passes through a portion of the semiconductor pattern, and is spaced apart from the semiconductor substrate, and the first semiconductor material is different from the second semiconductor material.

According to an embodiment, a semiconductor device may include a semiconductor substrate including a fin part defined by an isolation layer, a gate structure on the fin part, and a silicon-germanium (SiGe) pattern interposed between the fin part and the gate structure. The silicon-germanium (SiGe) pattern may include a pair of dopant regions, and a pair of contacts making contact with the pair of dopant regions, respectively, the silicon-germanium (SiGe) pattern may include a recessed part at an upper portion of the silicon-germanium (SiGe) pattern, a portion of the gate structure may fill the recessed part, the dopant regions may be disposed at an upper portion of the silicon-germanium (SiGe) pattern, and the pair of contacts may be spaced apart from the semiconductor substrate.

According to an embodiment, a semiconductor device may include a semiconductor substrate including cell active patterns on a cell region, and a peripheral active region, which is defined by an isolation layer, on a peripheral region in vicinity of the cell region, word lines (WL) crossing the cell active patterns, in the semiconductor substrate, bit lines (BL) crossing the word lines, on the semiconductor substrate, a bit line contact connected to each of the bit lines, at a central portion of each cell active pattern, a storage node contact on opposite end portions of each of the cell active patterns, a landing pad on the storage node contact, a capacitor on the landing pad, a gate structure on the semiconductor substrate, and a peripheral active pattern disposed between the semiconductor substrate and the gate structure, the peripheral active pattern may include a pair of dopant regions, and a pair of contacts connected to the pair of dopant regions, respectively, the pair of contacts may include a through plug and a contact pad, the peripheral active pattern may include a recessed part at an upper portion of the peripheral active pattern, a portion of the gate structure may fill the recessed part, the dopant regions may be disposed at an upper portion of the peripheral active pattern, the pair of contacts may be spaced apart from the semiconductor substrate, the cell active patterns may include a first semiconductor material, and the peripheral active pattern may include a second semiconductor material.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, the present disclosure will be described in detail by describing embodiments of the present disclosure with reference to the accompanying drawings.

Figure 1:
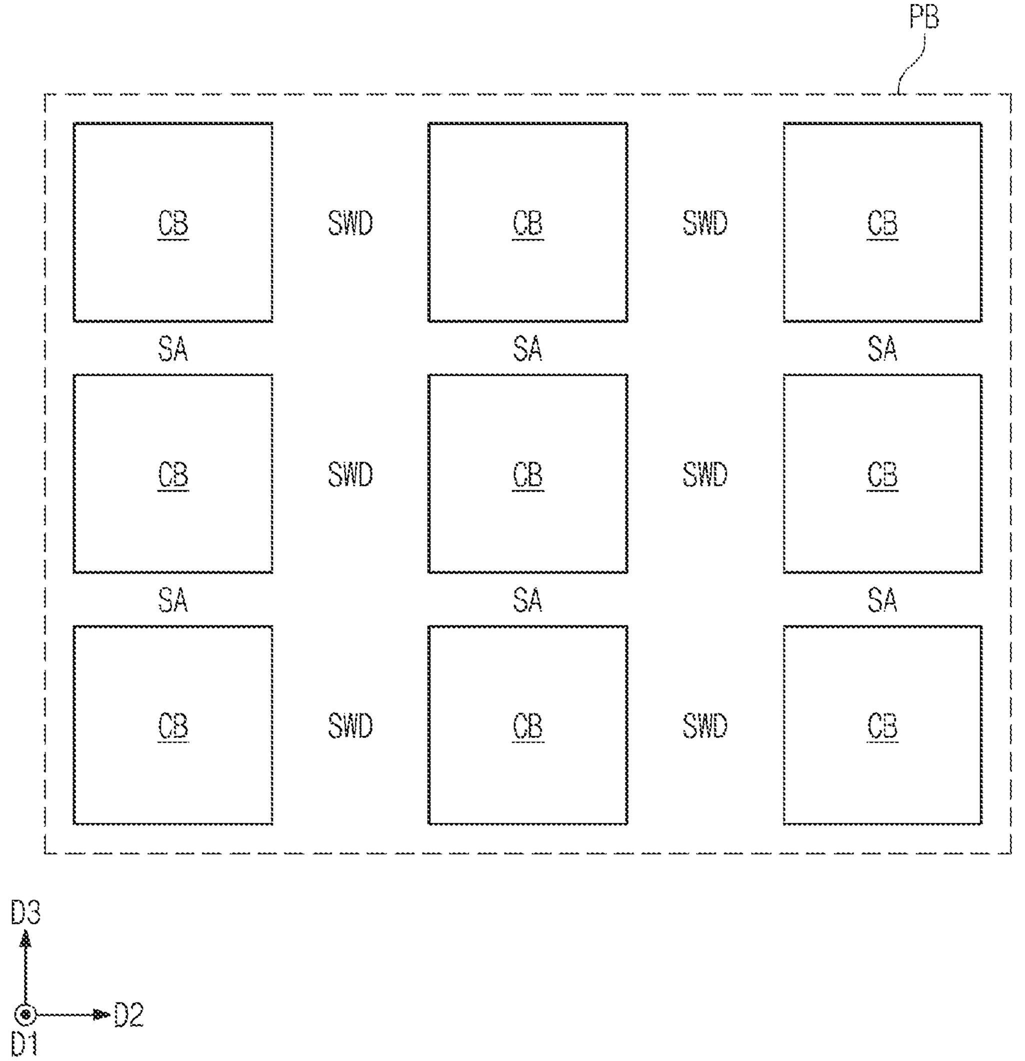
FIG. 1 is a block diagram of a semiconductor device according to an embodiment of the present disclosure.

FIG. 1 is a block diagram of a semiconductor device according to an embodiment of the present disclosure.

Referring to FIG. 1, a semiconductor device may include cell blocks CB and a peripheral block PB surrounding the cell blocks CB, where the cell blocks CB can occupy a portion of the peripheral block PB. The semiconductor device may be a memory device, and each of the cell blocks CB may include a cell circuit, such as a memory integrated circuit. The peripheral block PB may include various peripheral circuits required for operating the cell circuit, and the peripheral circuits may be electrically connected to the cell circuit.

The peripheral block PB may include sense amplifier circuits SA and sub-word line driver circuits SWD, where the sense amplifier circuits SA and sub-word line driver circuits SWD may be positioned between adjacent cell blocks CB. For example, the sense amplifier circuits SA may face each other with the above cell blocks CB interposed therebetween, and the sub-word line driver circuits SWD may face each other with the cell blocks CB interposed therebetween. The peripheral block PB may further include more power and ground driver circuits to operate a sense amplifier, but the concept of the present disclosure is not limited thereto.

Figure 2:
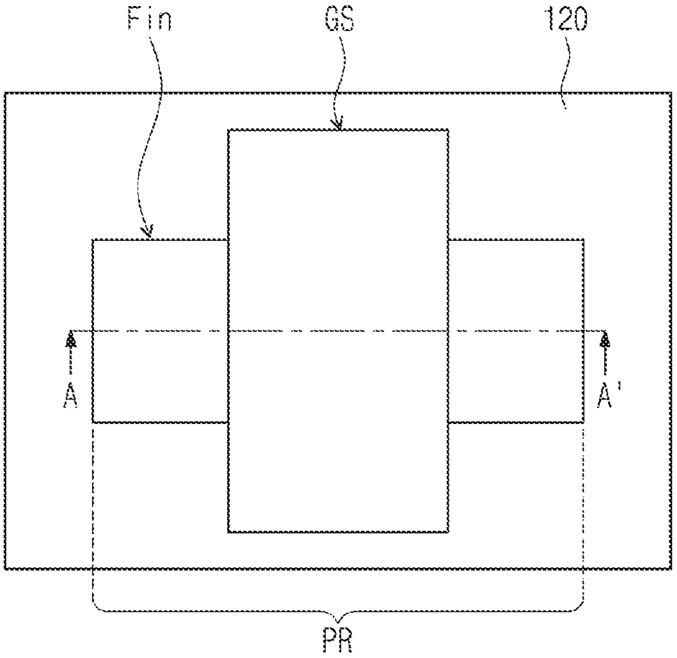
FIG. 2 is a plan view of a semiconductor device according to an embodiment of the present disclosure.
Figure 3:
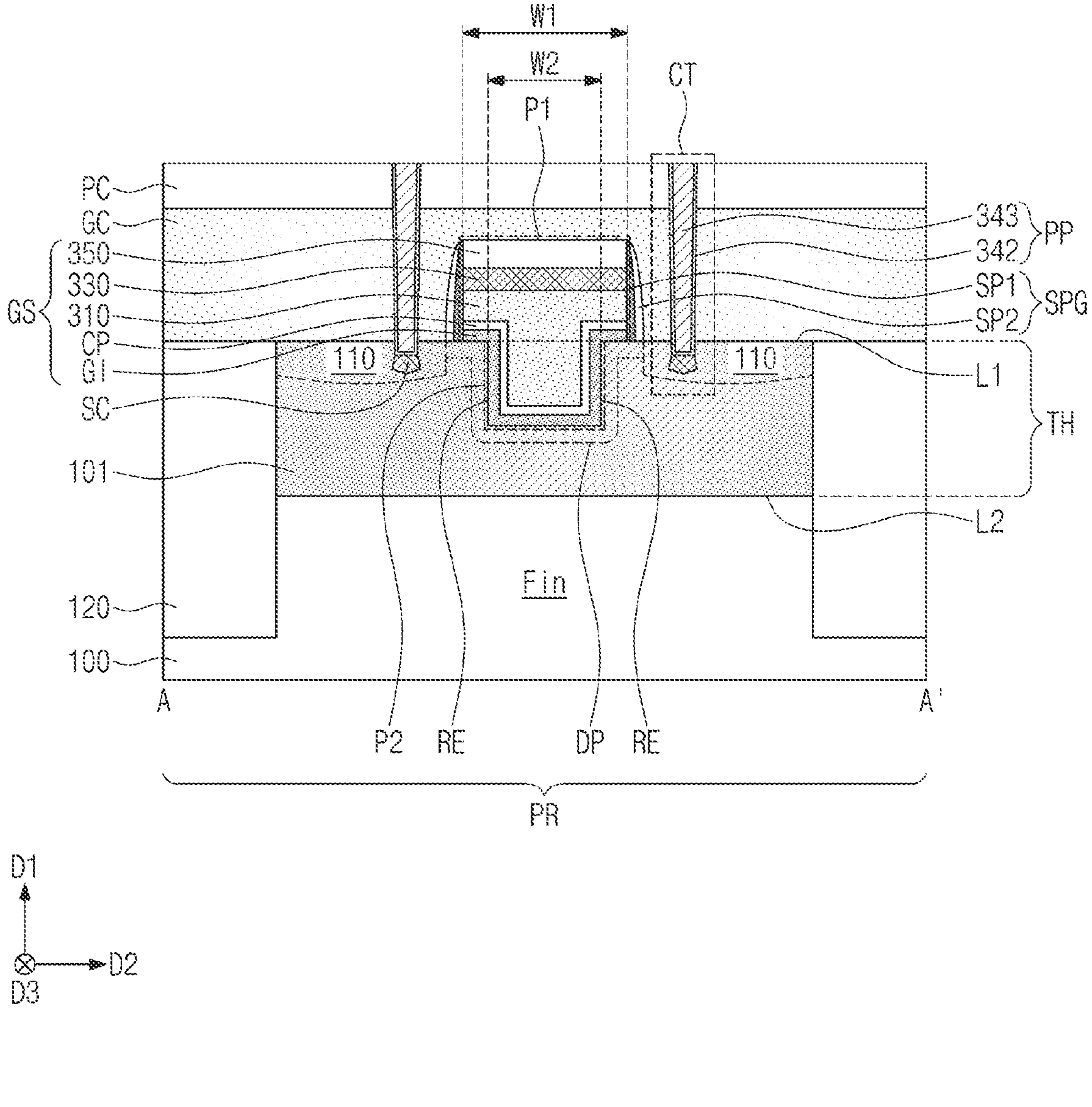
FIG. 3 is a view of a semiconductor device according to an embodiment of the present disclosure, and is a cross-sectional view taken along line A-A' of FIG. 2.

FIG. 2 is a plan view of a semiconductor device according to an embodiment of the present disclosure. FIG. 3 is a view of a semiconductor device according to an embodiment of the present disclosure, and is a cross-sectional view taken along line A-A' of FIG. 2.

Referring to FIGS. 2 and 3, the semiconductor device according to an embodiment may include a semiconductor substrate 100, a semiconductor pattern 101, a gate structure GS, contacts CT, and isolation layers 120.

Referring to FIG. 2, a gate structure GS may be on an isolation layer 120, and a semiconductor pattern 101 can be on a fin part FIN.

Referring to FIG. 3, the semiconductor substrate 100 may include a peripheral region PR. The peripheral region PR may be one region of the semiconductor substrate 100 having the peripheral block PB of FIG. 1. The semiconductor substrate 100 may include a first semiconductor material. The first semiconductor material may include, for example, silicon. The semiconductor substrate 100 may be, for example, a silicon substrate or a silicon-on-insulator (SOI) substrate. An isolation layer can be on a peripheral region PR adjacent to of the cell region CR.

The semiconductor substrate 100 may include a fin part FIN. The fin part FIN may be defined by the isolation layer 120 and may be one region of the semiconductor substrate 100 having the semiconductor pattern 101 therein. The fin part FIN may also be referred to as a peripheral active region Fin in the present specification. In the present specification, a first direction D1 is defined in one direction perpendicular to a top surface of the fin part FIN. The second direction D2 is defined in one direction parallel to the top surface of the fin part FIN. The third direction D3 is defined in one direction parallel to the top surface of the fin part FIN and perpendicular to the second direction D2.

The isolation layer 120 may be disposed on the semiconductor substrate 100. The isolation layer 120 can be at opposite ends of the fin part FIN and dopant regions 110 of a semiconductor pattern 101. The isolation layer 120 may include, for example, a silicon oxide, a silicon nitride, and/or a silicon oxynitride.

The semiconductor pattern 101 may be disposed on the semiconductor substrate 100. The semiconductor pattern 101 may also be referred to as the peripheral active semiconductor pattern 101 or peripheral active pattern 101 in the present specification. A boundary surface may be observed between the semiconductor pattern 101 and the semiconductor substrate 100. A second semiconductor material may include a semiconductor material different from the first semiconductor material. The second semiconductor material may include, for example, silicon-germanium (SiGe) in a silicon-germanium (SiGe) semiconductor pattern 101. In other words, the semiconductor pattern 101 may be a silicon-germanium pattern having a lattice direction of <100> or <110>. The semiconductor pattern 101 may have a thickness TH ranging from about 500 Å to about 700 Å. A lateral side of the semiconductor pattern 101 may be in contact with a sidewall of the isolation layer 120. A sidewall of the isolation layer 120 can be in contact with a lateral surface of the semiconductor pattern 101. In addition, the isolation layer 120 may have a portion in which the level of the top surface of the isolation layer 120 is the same as the level of the top surface of the semiconductor pattern 101.

The semiconductor pattern 101 includes a first surface L1 and a second surface L2 opposite the first surface, where the first surface L1 and the second surface L2 are facing each other. The second surface L2 may be in contact with the semiconductor substrate 100, and form an interface between the semiconductor pattern 101 and the semiconductor substrate 100. The first surface L1 and the second surface L2 of the semiconductor pattern 101 may correspond to a top surface and a bottom surface of the semiconductor pattern 101, respectively.

The semiconductor pattern 101 may include a channel region DP and a pair of dopant regions 110, where the dopant regions 110 can be at opposite ends of the channel region DP. Remaining regions of the semiconductor pattern 101 except for the channel region DP and the pair of dopant regions 110 are defined as a body region (the region beneath the dashed lines). The pair of dopant regions 110 may correspond to source/drain regions. The channel region DP and the dopant regions 110 may form at least a part of the semiconductor pattern 101, where the channel region DP and dopant regions 110 can be on the fin part FIN.

The body region of the semiconductor pattern 101 may have a first conductivity type, and the dopant regions 110 may have a second conductivity type. The first conductivity type and the second conductivity type may be different from each other. For example, the first conductivity type may be an N type, and the second conductivity type may be a P type. The pair of dopant regions 110 may be spaced apart from each other in the second direction D2 with a second part P2 of a gate structure GS interposed therebetween.

The semiconductor pattern 101 may include a recessed part RE formed at an upper portion thereof. For example, the shape of the recessed part RE may have a rectangular shape when viewed in a cross-sectional view. The cross-sectional shape of the recessed part RE is not limited to the illustrated shape, and may include a round shape or a tapered shape.

The gate structure GS may be disposed on the semiconductor pattern 101 and spaced apart from the semiconductor substrate 100, where the gate structure GS can be across at least a portion of the semiconductor pattern 101. The gate structure GS and the pair of dopant regions 110 may constitute a transistor.

The gate structure GS may be disposed to pass through a portion of the semiconductor pattern 101. A portion of the gate structure GS may fill the recessed part RE of the semiconductor pattern 101, where the portion of the gate structure GS can extend below the level of the dopant regions 110. In addition, the gate structure GS may extend in the third direction D3, where the gate structure GS can extend to opposite sides of the semiconductor pattern 101. The gate structure GS may be disposed to be spaced apart from the semiconductor substrate 100.

In detail, the gate structure GS may include a first part P1 and a second part P2 integrally connected to each other. The first part P1 may be disposed on the second part P2. The second part P2 of the gate structure GS may be a portion of the gate structure GS disposed under the first surface L1 of the semiconductor pattern 101. The first part P1 of the gate structure GS may be a remaining portion of the gate structure GS disposed on the first surface L1 of the semiconductor pattern 101. The second part P2 may be a portion protruding from the first part P1. The first part P1 may have a first width W1 in the second direction D2, and the second part P2 may have a second width W2 in the second direction D2. The second width W2 may be narrower than the first width W1. The second width W2 may correspond to a width of the recessed part RE in the second direction D2.

The gate structure GS may include a gate insulating pattern GI, a conductive pattern CP, a gate pattern 310, a metal-containing pattern 330, and a capping pattern 350 stacked sequentially on the semiconductor pattern 101.

The first part P1 of the gate structure GS may include a portion of the gate insulating pattern GI, a portion of the conductive pattern CP, a portion of the gate pattern 310, the metal-containing pattern 330, and the capping pattern 350, which are disposed on the first surface L1 of the semiconductor pattern 101. The second part P2 of the gate structure GS may include a remaining portion of the gate insulating pattern GI, a remaining portion of the conductive pattern CP, and a remaining portion of the gate pattern 310, which fill the recessed part RE of the semiconductor pattern 101. The second part P2 of the gate structure GS may be a portion of the gate structure GS disposed at a position equal to or lower than a position of the first surface L1 of the semiconductor pattern 101.

The gate insulating pattern GI may be formed along the shape of a bottom surface and inner surfaces of the recessed part RE. The gate insulating pattern GI may extend out of the recessed part RE to be in contact with the first surface L1 of the semiconductor pattern 101. The gate insulating pattern GI may include a high dielectric material. For example, the high dielectric material may include at least one of a hafnium oxide (HfO), hafnium silicate (HfSiO), a hafnium oxide nitride (HfON), (HfSiON), a hafnium silicon oxide (HfSiON), a lanthanum oxide (LaO), a lanthanum aluminum oxide (LaAlO), a zirconium oxide (ZrO), zirconium silicate (ZrSiO), a zirconium oxide nitride (ZrON), a barium strontium titanium oxide (BaSrTiO), a barium titanium oxide (BaTiO), a strontium titanium oxide (SrTiO), a yttrium oxide (YO), an aluminum oxide (AlO), or a lead scandium tantalum oxide (PbScTaO).

The conductive pattern CP may be disposed on the gate insulating pattern GI, while filling a portion of the recessed part RE. The conductive pattern CP may be similar to the filling shape of the gate insulating pattern GI. For example, the conductive pattern CP may include at least one selected from among aluminum (Al), an aluminum oxide film, a titanium nitride (TiN), a tungsten nitride (WN), or a ruthenium oxide ($RuO_2$).

The gate pattern 310 may be disposed on the conductive pattern CP. The gate pattern 310 may fill a remaining portion of the recessed part RE except for the part of the recessed part RE filled with the gate insulating pattern GI and the conductive pattern CP, and may have a T-shape. The gate pattern 310 may include, for example, polysilicon doped with or not doped with dopants.

The metal-containing pattern 330 may be disposed on the gate pattern 310. A bottom surface of the metal-containing pattern 330 may be in contact with a top surface of the gate pattern 310. The metal-containing pattern 330 may include, for example, a metal (e.g., tungsten, titanium, or tantalum).

The capping pattern 350 may be disposed on the metal-containing pattern 330. A bottom surface of the capping pattern 350 may be in contact with a top surface of the metal-containing pattern 330. The capping pattern 350 may include, for example, an electrically insulting nitride.

The first width W1 of the gate structure GS may correspond to a width, which is formed in the second direction D2, of a upper portion of the gate pattern 310 extending in the second direction D2, a width, which is formed in the second direction D2, of the metal-containing pattern 330, and a width, which is formed in the second direction D2, of the capping pattern 350.

The pair of spacer structures SPG may be disposed on opposite lateral sides of the first part P1 of the gate structure GS, respectively. Each of the pair of spacer structures SPG may include a first spacer SP1 and a second spacer SP2.

A pair of first spacers SP1 may be disposed on opposite lateral sides of the first part P1 of the gate structure GS, respectively. The first spacer SP1 may cover the lateral side of the first part P1 of the gate structure GS and expose a top surface of the first part P1. The first spacers SP1 may be disposed on the first surface L1 of the semiconductor pattern 101. Each of the first spacers SP1 may include a silicon nitride.

For example, each of the pair of first spacers SP1 may be formed of a single layer or a multilayer.

A pair of second spacers SP2 may be disposed on the first spacers SP1, where the second spacers SP2 may be adjoining the first spacers SP1. The second spacers SP2 may be disposed to be father away from the center of the gate structure GS, as compared to the first spacers SP1. The second spacers SP2 may be disposed on the first surface L1 of the semiconductor pattern 101. The second spacers SP2 may include, for example, a silicon oxide. The first spacers SP1 and the second spacers SP2 may extend in the third direction D3.

An interlayer insulating layer GC may be disposed on the isolation layer 120 and the semiconductor pattern 101. The interlayer insulating layer GC may cover the gate structure GS and the spacer structures SPG, where the upper surface of the interlayer insulating layer GC can be above the level of the upper surface of the capping pattern 350. The interlayer insulating layer GC may include, for example, at least one of a silicon nitride or a silicon oxide.

The peripheral capping layer PC may cover a top surface of the interlayer insulating layer GC. The peripheral capping layer PC may include at least one of a silicon nitride, a silicon oxide, or a silicon oxynitride. A plurality of wiring layers may be included on the peripheral capping layer PC.

A pair of contacts CT may be disposed on the semiconductor pattern 101.

Each of the pair of contacts CT may include a through plug PP and a contact pad SC, where the contact pad SC can be beneath and in electrical contact with the through plug PP. The through plug PP may be formed through the peripheral capping layer PC and the interlayer insulating layer GC in the first direction D1, respectively, and may extend to the dopant region 110 of the semiconductor pattern 101. The through plug PP may pass through an upper portion of the semiconductor pattern 101. The through plug PP may include a metal-containing material such as tungsten. A pair of contacts CT may make physical and electrical contact with a pair of dopant regions 110, where a first contact CT can make physical and electrical contact with a first dopant region 110 and a second contact CT can make physical and electrical contact with a second dopant region 110.

The through plug PP may include an anti-diffusion pattern 342 and a metal pattern 343 on the anti-diffusion pattern 342. The anti-diffusion pattern 342 may be interposed between the metal pattern 343 and the peripheral capping pattern PC, the interlayer insulating layer GC, and the semiconductor pattern 101.

The anti-diffusion pattern 342 may include, for example, a metal nitride (TiN, TSN, and TaN). The metal pattern 343 may include a metal material such as tungsten (W) or aluminum (Al).

Contact pads SC may be disposed on lower regions of the pair of through plugs PP, respectively. The contact pad SC may be a portion in direct contact with the dopant region 110. The contact pad SC may have, for example, a pentagonal shape, when viewed in a cross-sectional view. The contact pad SC is not limited to the illustrated shape and may have various other shapes. The contact pad SC may include silicide, where the silicide may be a compound of metal and silicon. The silicide may include a metal such as cobalt (Co), titanium (Ti), or nickel (Ni).

A semiconductor device can have a channel region formed in a silicon substrate, in contrast to a channel region formed in a silicon-germanium (SiGe) pattern. Accordingly, as compressive stress is increased, hole mobility is increased. In addition, as the channel region is formed in a silicon-germanium pattern, a band gap can be reduced by 200 mV, as compared to a silicon substrate. Control of compressive stress can make it easier to control the threshold voltage. In addition, the higher germanium concentration in the silicon-germanium pattern can improve contact resistance.

Figure 4:
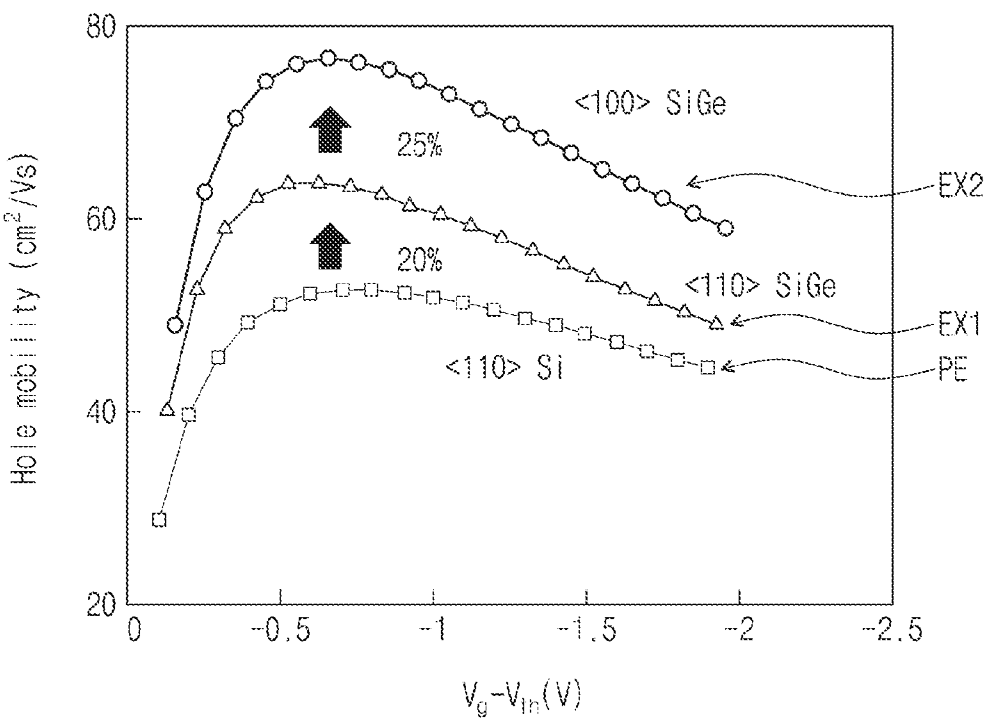
FIG. 4 is a graph illustrating hole mobility, as a voltage is applied, according to embodiments and comparative examples of the present disclosure.

FIG. 4 is a graph illustrating hole mobility, as a voltage is applied, according to embodiments and comparative examples of the present disclosure.

According to a first embodiment (EX1), a SiGe pattern having a lattice direction of <110> was used as the semiconductor pattern 101 of FIG. 3. According to a second embodiment (EX2), a SiGe pattern having a lattice direction of <100> was used as the semiconductor pattern 101 of FIG. 3. According to a comparative example (PE), the semiconductor pattern 101 is omitted, which differs from the first embodiment (EX1) and the second embodiment (EX2). According to the comparative example (PE), a channel region and a source/drain region were formed in the fin part Fin having a lattice direction of <110>. According to the first embodiment (EX1) and the second embodiment 2 (EX2) have the shape in which a portion of the gate structure GS is filled in the semiconductor pattern 101 as described in FIG. 3. According to the comparative example (PE), the portion of the gate structure GS is filled in the fin part Fin.

When the first embodiment (EX1) and the second embodiment (EX2) are compared to the comparative example (PE), the hole mobility according to the first embodiment (EX1) and the second embodiment (EX2) was observed to be greater than the hole mobility according to the comparative example (PE). The second embodiment (EX2) shows the hole mobility increased by about 20% as compared to the hole mobility according to the comparative example (PE). The first embodiment (EX1) shows the hole mobility increased by about 25% as compared to the hole mobility according to the second embodiment (EX2).

Since a pattern (SiGe pattern) including SiGe, which is a material different from Si, is formed on a Si substrate, compressive stress may be increased in the formed SiGe pattern. As the compressive stress is increased in the SiGe pattern, when the SiGe pattern is used for a channel region, the hole mobility may be increased, the current flow may be improved.

FIG. 5A to FIG. 5I are views for explaining a method for a semiconductor device according to an embodiment of the present disclosure, and are cross-sectional views taken along line A-A' of FIG. 2.

Figure 5A:
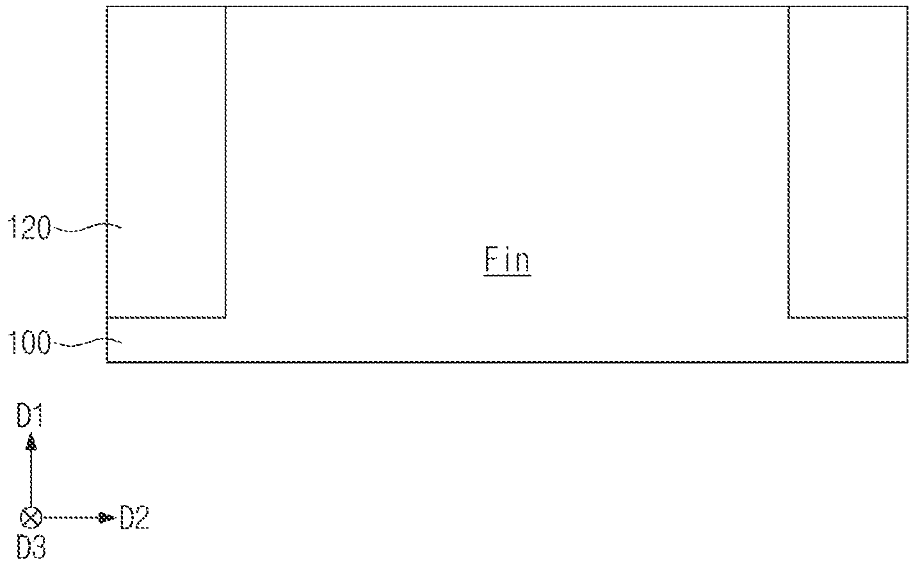
FIGS. 5A to 5J are views illustrating a method for manufacturing a semiconductor device according to an embodiment of the present disclosure.

Referring to FIG. 5A, the isolation layer 120 can be formed on the semiconductor substrate 100 to define an active region. The isolation layer 120 may be formed using an isolation process such as a shallow trench isolation (STI) process.

In various embodiments, a mask pattern, which selectively exposes a region corresponding to a device isolation region, can be formed. A device isolating trench is formed by etching the semiconductor substrate 100 using the mask pattern as an etching mask. As the device isolating trench is formed, the fin part Fin may be formed on the semiconductor substrate 100. Thereafter, materials, such as silicon oxide and/or silicon nitride, can be formed in the device isolating trench and then planarized to form the isolation layer 120. Thereafter, the mask pattern is removed, such that the isolation layer 120 has a shape surrounding the fin part Fin, where the isolation layer 120 can cover opposite end walls and opposite sidewalls of the fin part Fin.

Figure 5B:
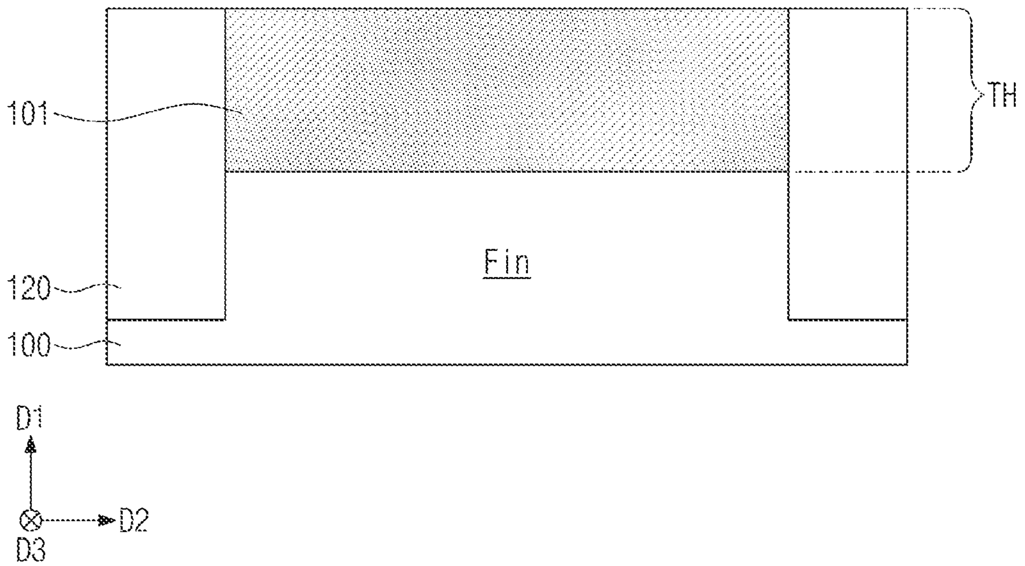

Referring to FIG. 5B, the semiconductor pattern 101 can be formed on the semiconductor substrate 100. The semiconductor pattern 101 may include silicon-germanium (SiGe). The thickness TH of the semiconductor pattern 101 may be in a range from about 500 Å to about 700 Å.

In various embodiments, the semiconductor pattern 101 may be formed through a recrystallization process after injecting Ge into an upper portion of the fin part Fin at a high concentration.

In various embodiments, the semiconductor pattern 101 may be formed on the fin part Fin through an epitaxial growth process, after partially etching the fin part Fin. The epitaxial growth process may include a liquid phase epitaxy, a vapor phase epitaxy, and/or a molecular beam epitaxy process.

The semiconductor pattern 101 may be formed in a manner preventing a step difference between the top surface of the semiconductor pattern 101 and the top surface of the semiconductor substrate 100 of each cell block (CB).

An N-type body region may be formed by injecting pentavalent impurities during or after the formation of the semiconductor pattern 101.

Figure 5C:
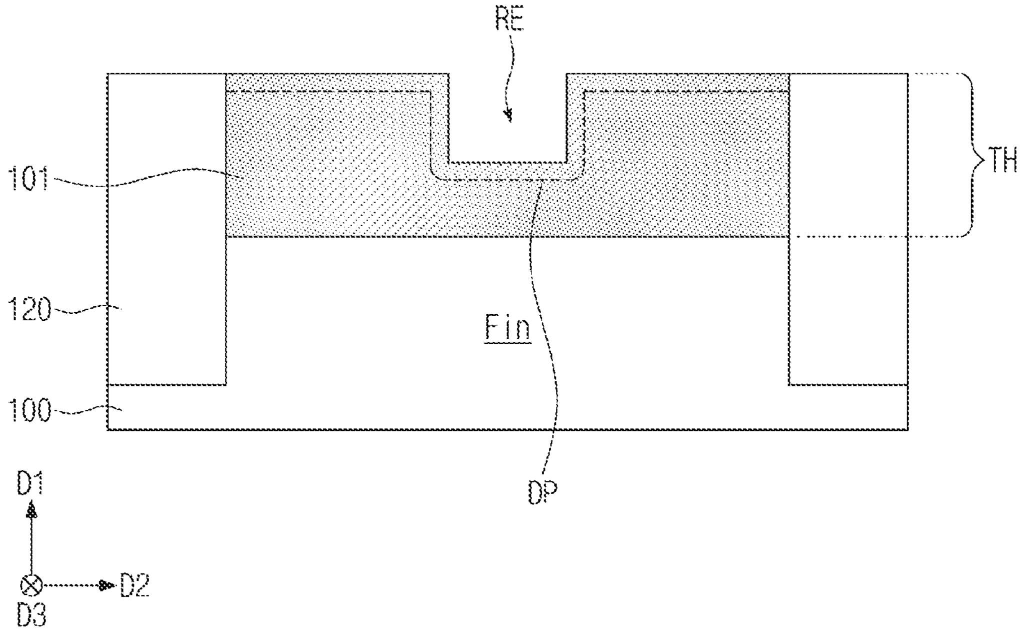

Referring to FIG. 5C, the recessed part RE may be formed in the top surface of the semiconductor pattern 101. A mask pattern can be formed to selectively expose a portion of the semiconductor pattern 101 for forming the recessed part RE. Thereafter, the exposed portion of the semiconductor pattern 101 can be removed by selective etching, using the mask pattern as an etching mask, to form the recessed part RE. The recessed part RE may be formed through a dry or wet etching process. The shape of the recessed part RE is not limited to the shape illustrated in the drawings, and may include a round or tapered shape.

In various embodiments, the channel region DP may be formed by implanting, for example, trivalent dopants using the mask pattern as an ion injection mask. According to an embodiment, the process of implanting the dopants to form the channel region DP may be omitted.

Figure 5D:
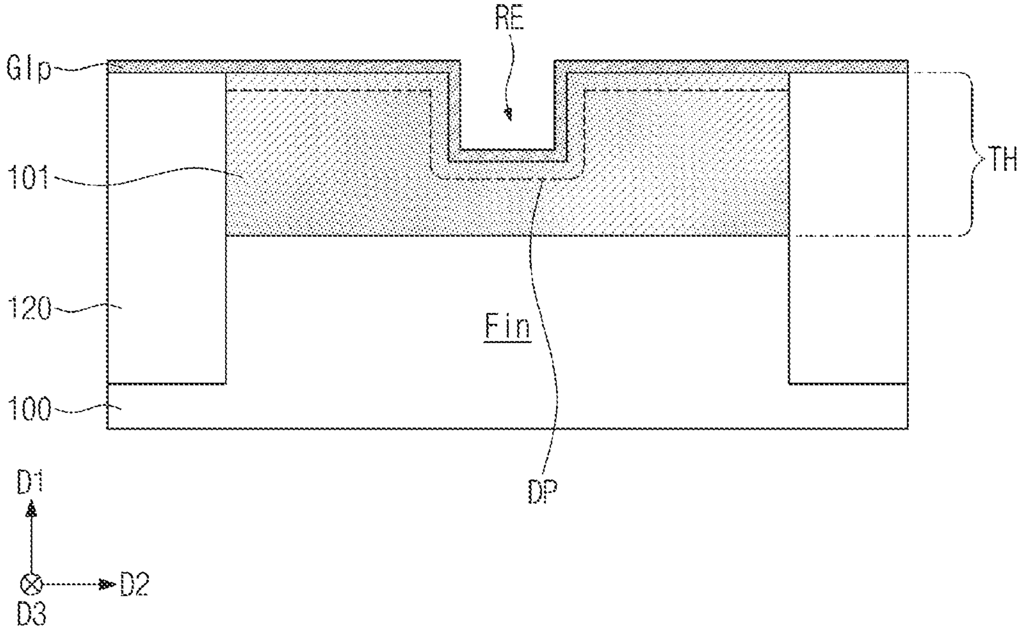

Referring to FIG. 5D, the gate insulating layer GIp may be formed in the recessed part Re and along an upper surface of the semiconductor pattern 101 and isolation layer 120. The gate insulating layer GIp may include materials formed through a thermal oxidation process. The gate insulating layer GIp may be conformally formed along the shape of the recessed part RE. However, the gate insulating layer GIp may not fill in the entire portion of an inner portion of the recessed part RE. The bottom surface of the gate insulating layer GIp may be in contact with the top surface of the isolation layer 120 and the semiconductor pattern 101.

Figure 5E:
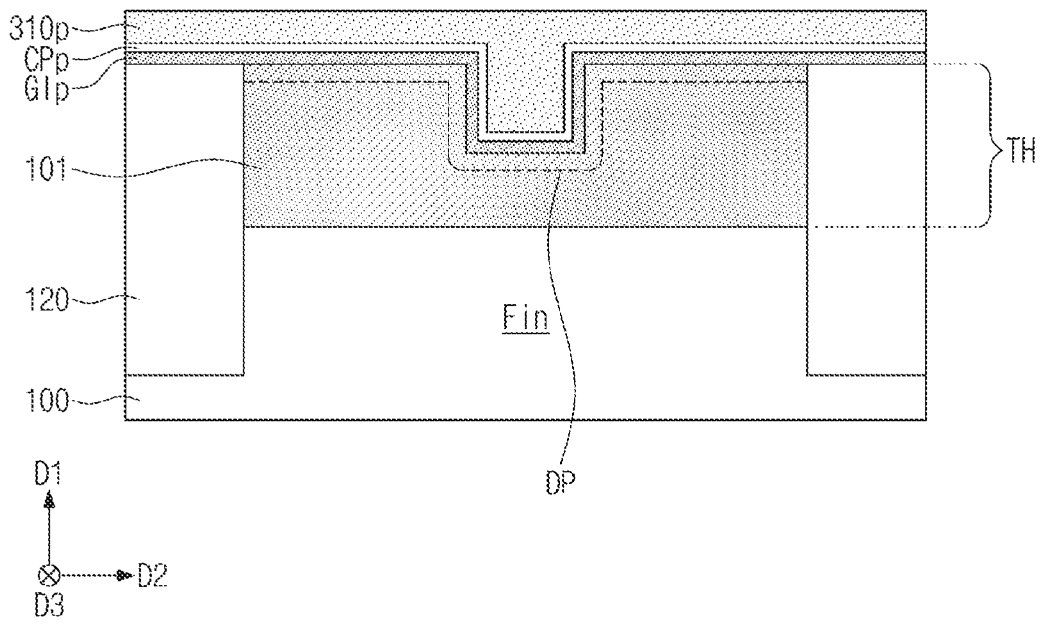

Referring to FIG. 5E, the conductive layer CPp and the gate layer 310*p* may be sequentially formed on the gate insulating layer GIp, where the conductive layer CPp can be between the gate insulating layer GIp and the gate layer 310*p*.

A conductive layer CPp may be interposed between the gate insulating layer GIp and the gate layer 310*p* through a patterning process. The sidewalls of the conductive layer CPp may be aligned in line with the sidewalls of the isolation layer 120 and the gate insulating layer GIp. The conductive layer CPp may be formed along the shape of the gate insulating layer GIp and recessed part RE.

A portion of the gate layer 310*p* can fill in the recessed part RE. The gate layer 310*p* may be deposited through a Low Pressure Chemical Vapor Deposition (LPCVD) process, a chemical vapor deposition (CVD) process, a sputtering process, a Plasma enhanced chemical vapor deposition (PECVD), a pulsed laser deposition process, or an atomic layer deposition (ALD) process. The gate layer 310*p* may include polysilicon. When the polysilicon is formed, the gate layer 310*p* may be completely formed by implanting dopants through an in-situ doping process.

Figure 5F:
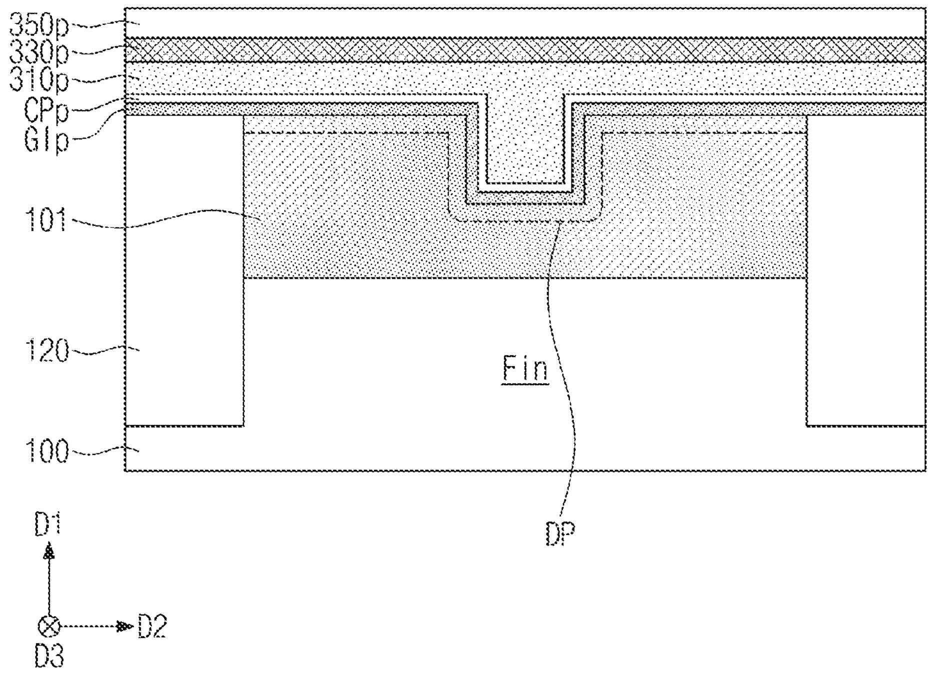

Referring to FIG. 5F, the metal-containing layer 330*p* and the capping layer 350*p* may be sequentially formed on the gate layer 310*p*.

Figure 5G:
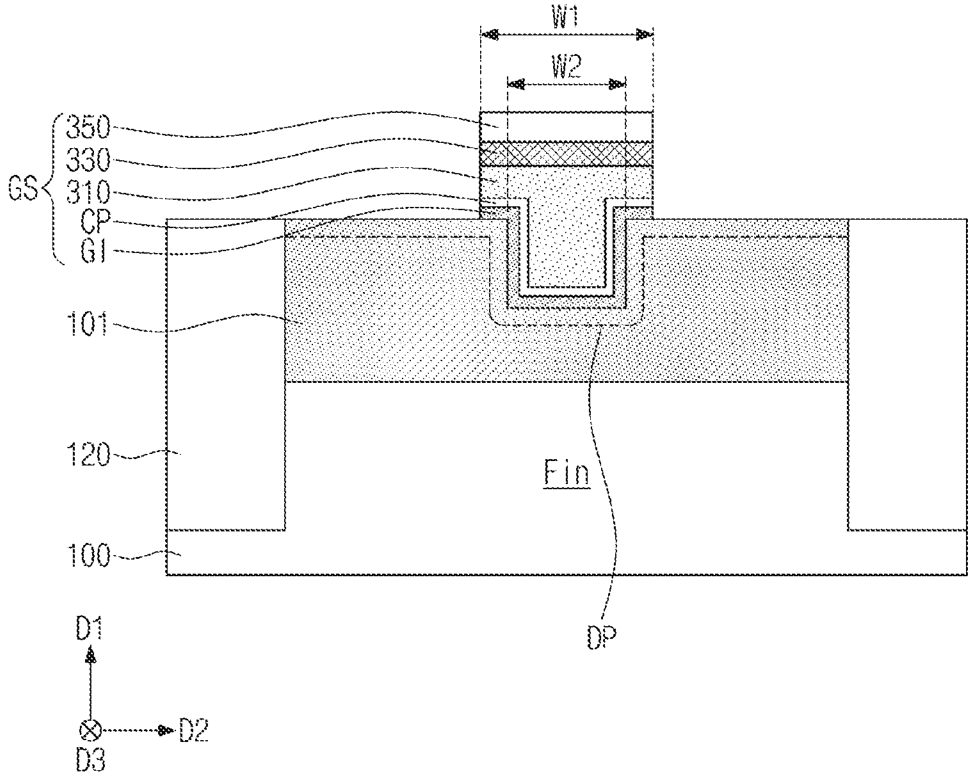

Referring to FIG. 5G, the gate insulating layer GIp, the conductive layer CPp, the gate layer 310*p*, the metal-containing layer 330*p*, and the capping layer 350*p* may be patterned to form the gate insulating pattern GI, the conductive pattern CP, the gate pattern 310, the metal-containing pattern 330, and the capping pattern 350, respectively. The patterning process can include, for example, an etching process using a mask pattern, and may be performed until the first surface L1 of the semiconductor pattern 101 is exposed. The width W1 of the gate insulating layer GIP, the conductive layer CPp, the gate layer 310*p*, the metal-containing layer 330*p*, and the capping layer 350*p* protected by the mask pattern may be adjusted to be wider than the width W2 of the recessed part RE. As the gate insulating pattern GI, the conductive patterns CP, the gate pattern 310, the metal-containing pattern 330, and the capping patterns 350 are formed, the gate structure GS may be formed.

Figure 5H:
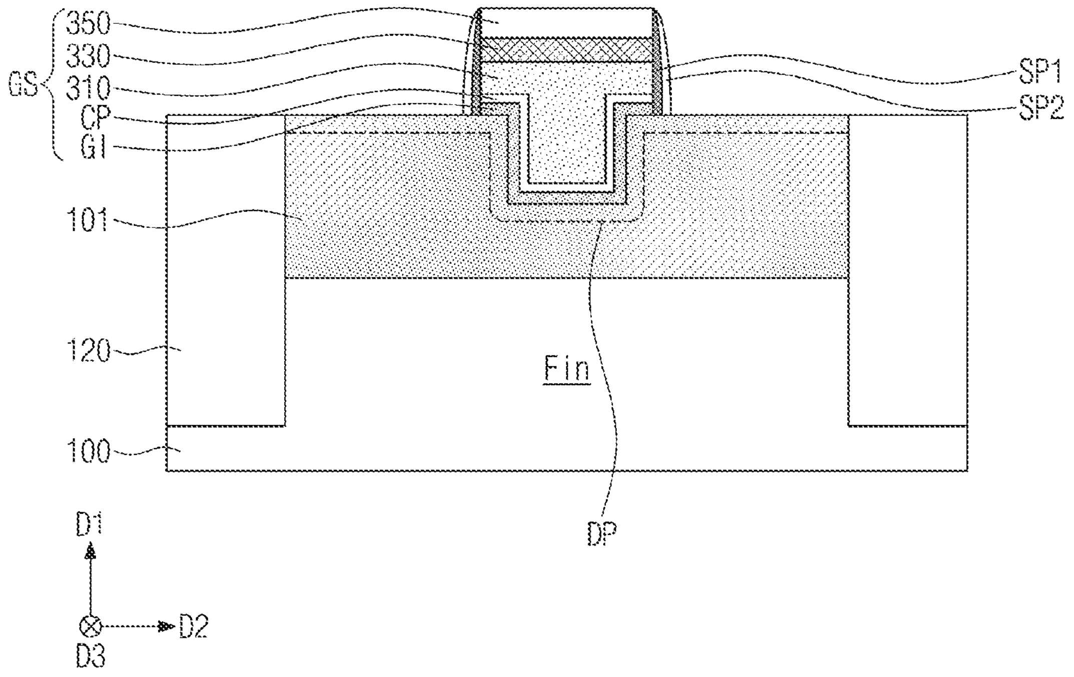

Referring to FIG. 5H, the pair of spacer structures SPG may be formed on opposite sides of the gate structure GS, respectively. In detail, after the first spacer SP1 is formed on the lateral side of the gate structure GS, the second spacer SP2 may be formed on the first spacer SP1. The bottom surfaces of the first spacer SP1 and the second spacer SP2 may be in contact with the first surface L1 of the semiconductor pattern 101. Portions of the semiconductor pattern 101 may be exposed along thew sides of the second spacer SP2.

Figure 5I:
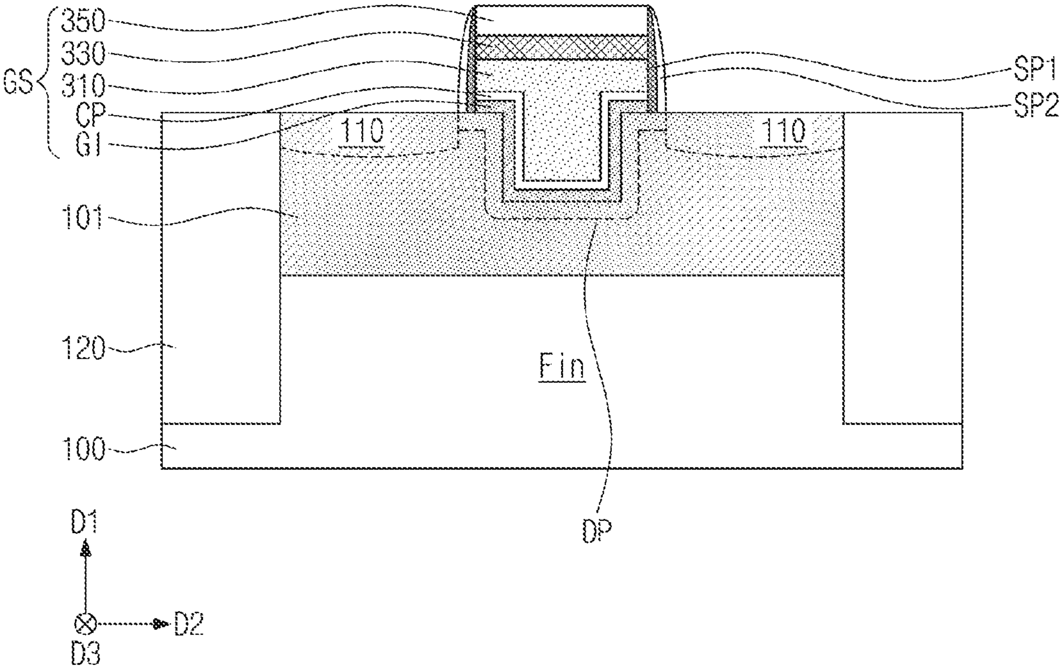

Referring to FIG. 5I, the pair of dopant regions 110 may be formed on the semiconductor pattern 101. The pair of dopant regions 110 may be formed by ion-implanting, for example, trivalent dopants into the surface of the first surface L1 exposed using the gate structure GS as a mask.

Figure 5J:
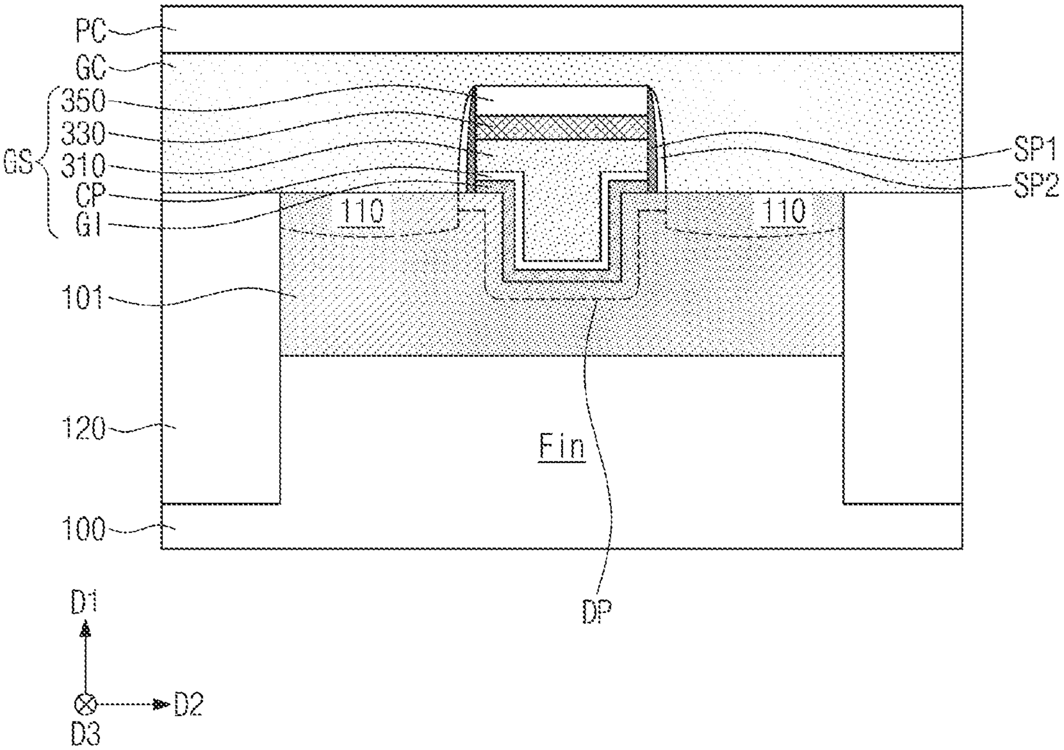

Referring to FIG. 5J, the interlayer insulating layer GC, can be formed on the isolation layer 120 and the semiconductor pattern 101, and cover the gate structure GS. The peripheral capping layer PC may be formed on the interlayer insulating layer GC.

Referring back to FIG. 3, the contacts CT may be formed on opposite sides of the gate structure GS, respectively. The contact CT may be formed in a space formed by etching the peripheral capping layer PC, the interlayer insulating layer GC, and the semiconductor pattern 101. The contact pad SC may be formed in the space formed by etching the peripheral capping pattern PC, the interlayer insulating layer GC, and the semiconductor pattern 101. Thereafter, the through plug PP may be formed in the contact pad SC to form the contact CT.

Figure 6:
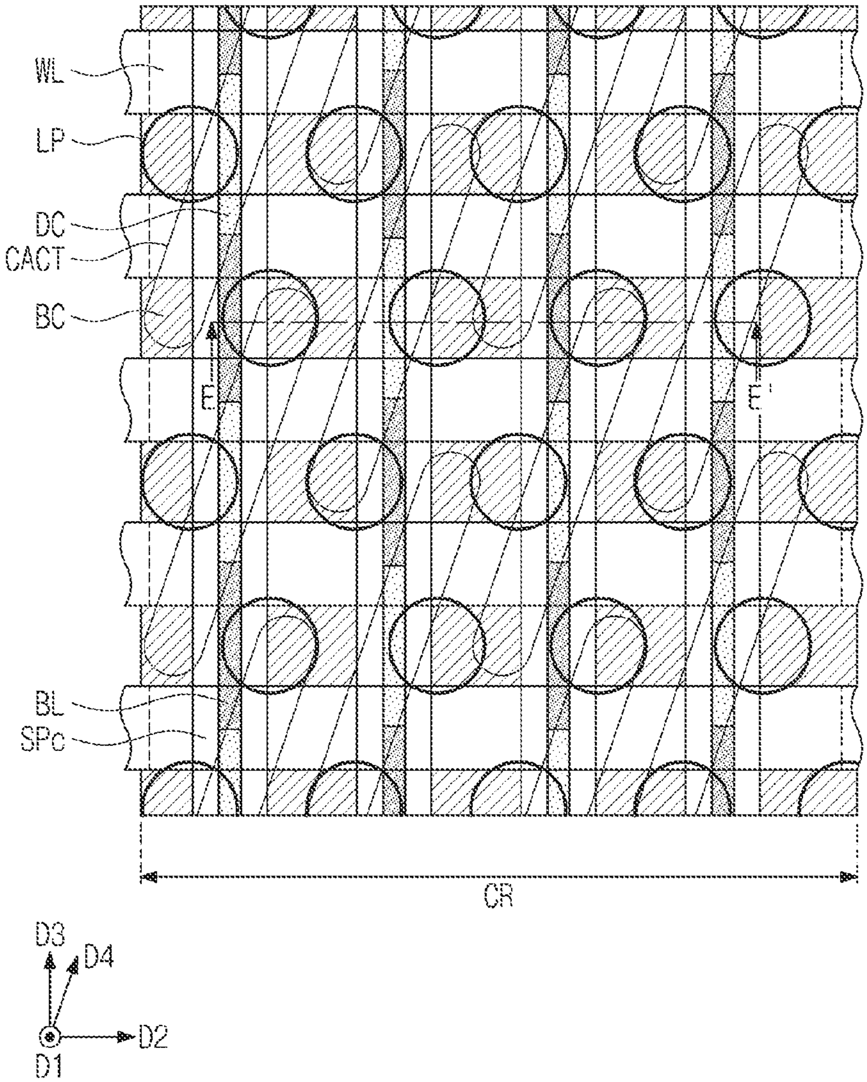
FIG. 6 is a plan view of a semiconductor device according to an embodiment of the present disclosure.

FIG. 6 is a plan view of a semiconductor device according to an embodiment of the present disclosure.

Figure 7:
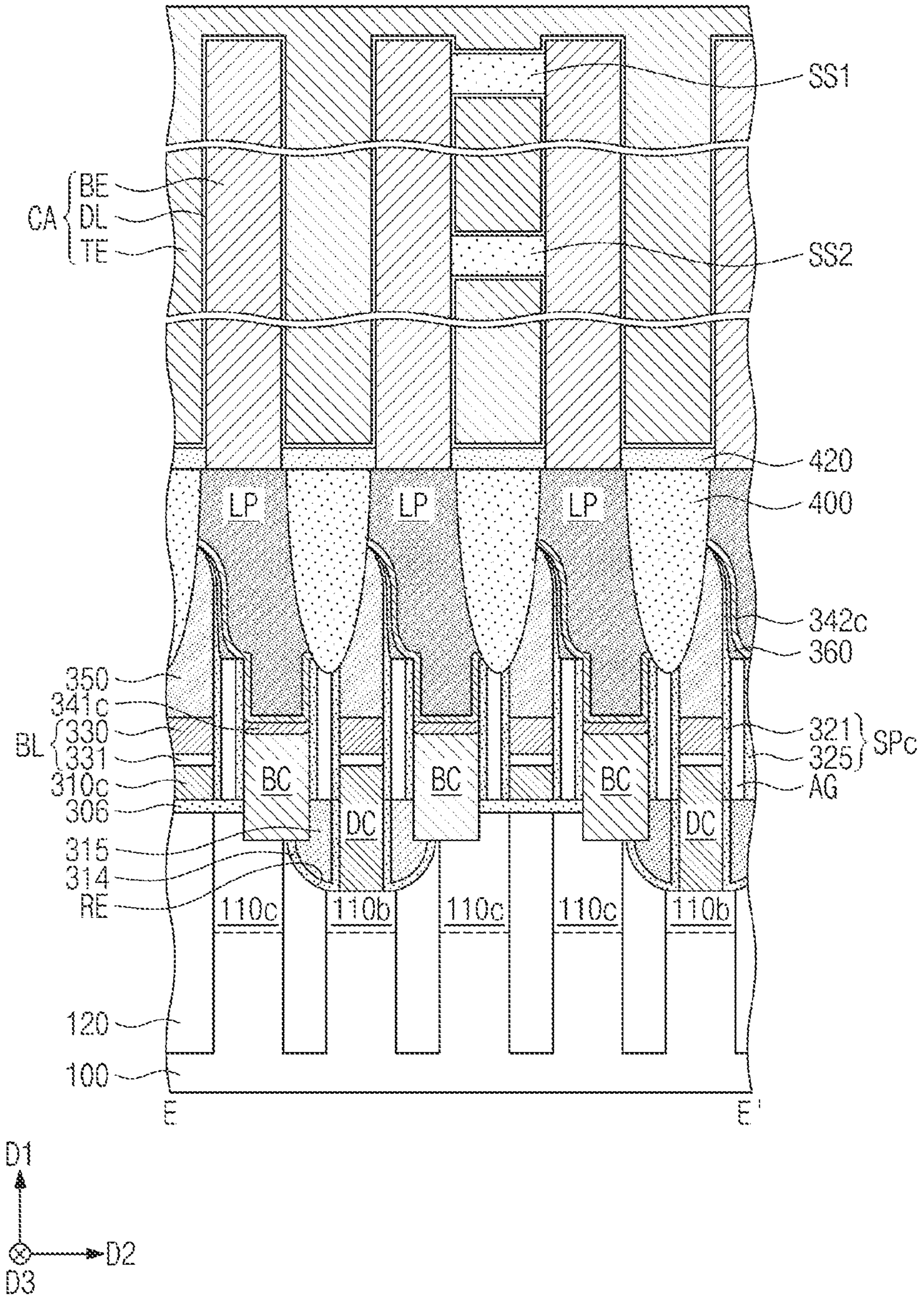
FIG. 7 is a cross-sectional view of a semiconductor device according to an embodiment of the present disclosure, which is taken along line E-E' of FIG. 6.

FIG. 7 is a cross-sectional view of a semiconductor device according to an embodiment of the present disclosure, which is taken along line E-E' of FIG. 6.

Referring to FIGS. 6 and 7, the semiconductor substrate 100 including a cell region CR may be provided. The cell region CR may be a region of the semiconductor substrate 100 for providing the cell blocks CB of FIG. 1.

Referring to FIG. 6, cell active patterns CACT may be disposed on the cell region CR of the semiconductor substrate 100. When viewed in a plan view, the cell active patterns CACT may be spaced apart from each other in the second direction D2 and the third direction D3. The cell active patterns CACT may have the shape of a bar which is parallel to the bottom surface of the semiconductor substrate 100 and extending in a fourth direction D4 crossing the second direction D2 and the third direction D3.

The isolation layers 120 may be disposed between the cell active patterns CACT on the cell region CR. The isolation layers 120 may be disposed in the semiconductor substrate 100 to define the active patterns CACT. The cell active patterns CACT may be a portion of the semiconductor substrate 100.

The cell active patterns CACT may include a first semiconductor material. The first semiconductor material may include silicon.

Word lines WL may cross the cell active patterns CACT and the device isolation layers 120 on the cell region CR. The word lines WL may be disposed in grooves formed in the cell active patterns CACT and the isolation layers 120. The word lines WLs may extend in the second direction D2 and may be spaced apart from each other in the third direction D3. The word lines WL may be filled in the semiconductor substrate 100.

Referring to FIG. 7, the first cell dopant regions 110*b* and the second cell dopant regions 110*c* may be provided in the cell active patterns CACT. Each of the first cell dopant regions 110*b* may be provided between a pair of word lines WLs crossing each of the cell active patterns CACT. The second cell dopant regions 110*c* may be provided in opposite edge regions of each of the cell active patterns CACT.

A buffer pattern 306 may cover the cell active patterns CACT, the isolation layers 120, and the word lines WL on the semiconductor substrate 100. The buffer pattern 306 may include, for example, a silicon oxide, a silicon nitride, and/or a silicon oxynitride.

Bit lines BL may be disposed on the buffer pattern 306. The bit lines BL may extend in the third direction D3 and may be spaced apart from each other in the second direction D2. Each of the bit lines BLs may include a barrier pattern 331 and a metal-containing pattern 330 which are sequentially stacked.

Cell polysilicon patterns 310*c* may be interposed between the bit lines BL and the buffer pattern 306. The cell polysilicon patterns 310*c* may include the same material as the gate pattern 310 of FIG. 3. A first cell ohmic pattern may be interposed between the cell polysilicon pattern 310*c* corresponding to the barrier pattern 331. The first cell ohmic pattern may contain, for example, silicide.

Bit line contacts DC may be interposed between the bit lines BL and the first cell dopant regions 110*b*, respectively. The bit lines BL may be electrically connected to the first cell dopant regions 110*b* through the bit line contacts DC. The bit line contacts DC may include polysilicon doped with or not doped with dopants.

The bit line contacts DC may be disposed in the recessed part RE. The recessed part RE may be provided above the first cell dopant regions 110*b* and above the device isolation layers 120 adjacent thereto. The first buried insulation pattern 314 and the second buried insulation pattern 315 may fill the remaining portion of the recessed part RE. A bit line contact DC can be connected to each of the bit lines, at a central portion of each cell active pattern CACT.

The cell capping pattern 350 may extend in the second direction D2 on each of the bit lines BL. The cell capping pattern 350 may include, for example, silicon nitride.

A lateral side of each of the cell polysilicon patterns 310*c*, an upper lateral side of each of the bit line contacts DC, a lateral side of each of the bit lines BL, and a lateral side of the cell capping pattern 350 may be covered with a bit line spacer SPc. The bit line spacer SPc may extend in the first direction D1 on each of the bit lines BL.

The bit line spacer SPc may include a first sub-spacer 321 and a second sub-spacer 325 spaced apart from each other. For example, the first sub-spacer 321 and the second sub-spacer 325 may be spaced apart from each other by an air gap AG. The first sub-spacer 321 may be in contact with the lateral side of each of the bit lines BL, and may extend onto the lateral side of the capping pattern 350. The second sub-spacer 325 may be provided along a lateral side of the first sub-spacer 321. Each of the first and second sub-spacers 321 and 325 may include, for example, a silicon nitride.

The upper spacer 360 may cover a lateral side of the first sub-spacer 321 and may extend to a top surface of the second sub-spacer 325. The upper spacer 360 may further cover the air gap AG.

Each of the storage node contacts BC may be interposed between bit lines BL, which are adjacent to each other. The storage node contacts BC may be spaced apart from each other in the second direction D2 and the third direction D3. A storage node contact BC can be on opposite end portions of each of the cell active patterns CACT. The storage node contacts BC may include polysilicon doped with or not doped with dopants.

A second cell ohmic pattern 341*c* may be disposed on each of the storage node contacts BC. The second cell ohmic pattern 341*c* may include, for example, a metal silicide.

The cell anti-diffusion pattern 342*c* may conformally cover the second cell ohmic pattern 341*c*, the bit line spacer SPc, and the cell capping pattern 350*c*. The cell anti-diffusion pattern 342*c* may include the same material as the anti-diffusion pattern 342 of FIG. 3. The cell anti-diffusion pattern 342*c* may include, for example, a metal nitride (for example TiN, TSN, or TaN). The second cell ohmic pattern 341*c* may be interposed between the cell anti-diffusion pattern 342*c* and each of the storage node contacts BC.

Landing pads LPs may be disposed on the storage node contacts BC, respectively. The landing pads LPs may be spaced apart from each other in the second direction D2 and the third direction D3. The landing pads LPs may include metal (for example, tungsten).

The filling pattern 400 may surround each of the landing pads LP. The filling pattern 400 may be interposed between landing pads LPs adjacent to each other.

Lower electrodes BE may be disposed on the landing pads LP, respectively. The lower electrodes BE may include at least one of polysilicon doped with dopants, a metal nitride such as titanium nitride, or a metal film, such as tungsten, aluminum, or copper. Each of the lower electrodes BE may have the shape of a cylinder, a hollowed cylinder, or a cup. The upper support pattern SS1 may support upper sidewalls of the lower electrodes BE, and the lower support pattern SS2 may support lower sidewalls of the lower electrodes BE. The upper and lower support patterns SS1 and SS2 may include an insulating material such as a silicon nitride, a silicon oxide, or a silicon oxynitride.

An etching stop pattern 420 may be provided on the filling pattern 400 between the lower electrodes BE. A dielectric layer DL may cover surfaces of the lower electrodes BE and surfaces of the upper and lower support patterns SS1 and SS2. The dielectric layer DL may include at least one of a silicon oxide, a silicon nitride, a silicon oxynitride, or a high dielectric material. The upper electrode TE may be disposed on the dielectric layer DL and may fill a space between the lower electrodes BE. The upper electrode TE may include at least one of a polysilicon layer doped with dopants, a silicon germanium layer doped with impurities, a metal nitride, such as a titanium nitride, and a metal layer including tungsten, aluminum, and copper. The lower electrodes BE, the dielectric layer DL, and the upper electrode TE may constitute a capacitor CA.

According to the present disclosure, the semiconductor device may include the silicon-germanium (SiGe) pattern and the transistor on the silicon-germanium (SiGe) pattern. The channel region and the source/drain region of the transistor may be provided in the silicon-germanium (SiGe) pattern. As the silicon-germanium (SiGe) pattern is used for the channel, the mobility of the hole may be increased, as compared to the silicon for the channel. As the silicon-germanium (SiGe) pattern is used for the source/drain region, the contact resistance may be decreased, as compared to silicon for the channel, when the contact is connected. Accordingly, the electrical characteristic may be improved, and the reliability for the semiconductor device may be increased.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A semiconductor device comprising:

a semiconductor substrate including a first semiconductor material;

a gate structure on the semiconductor substrate;

a semiconductor pattern including a second semiconductor material, between the semiconductor substrate and the gate structure; and an isolation layer disposed on a lateral surface of the semiconductor pattern on the semiconductor substrate, wherein the semiconductor pattern is in contact with the semiconductor substrate, wherein the gate structure passes through a portion of the semiconductor pattern, and is spaced apart from the semiconductor substrate, wherein the first semiconductor material is different from the second semiconductor material, wherein the semiconductor pattern includes a recessed part at an upper portion thereof, and a portion of the gate structure fills the recessed part, wherein the gate structure includes a gate insulating pattern disposed in the recessed part and extending out of the recessed part onto a top surface of the semiconductor pattern, and wherein a top surface of the gate insulating pattern is positioned higher than a top surface of the isolation layer.

2. The semiconductor device of claim 1, wherein the first semiconductor material is Si, and wherein the second semiconductor material is SiGe.

3. The semiconductor device of claim 1, wherein the gate structure includes a first part and a second part protruding from the first part, wherein the semiconductor pattern includes a first surface, which is the top surface of the semiconductor pattern, and a second surface facing each other, wherein the second surface is in contact with the semiconductor substrate, wherein the first part of the gate structure is disposed on the first surface of the semiconductor pattern, and wherein the second part is disposed under the first surface of the semiconductor pattern.

4. The semiconductor device of claim 3, wherein the second part is spaced apart from the second surface of the semiconductor pattern.

5. The semiconductor device of claim 3, wherein the first part has a first width in a second direction parallel to a top surface of the semiconductor substrate, wherein the second part has a second width in the second direction, and wherein the second width is narrower than the first width.

6. The semiconductor device of claim 3, further comprising:

spacers disposed on opposite sides of the first part of the gate structure.

7. The semiconductor device of claim 1, wherein the isolation layer has a portion in which a level of the top surface of the isolation layer is the same as a level of the top surface of the semiconductor pattern.

8. The semiconductor device of claim 7, further comprising:

an interlayer insulating layer (GC) disposed on the isolation layer and on the semiconductor pattern, including the second semiconductor material, and covering the gate structure.

9. The semiconductor device of claim 1, wherein a sidewall of the isolation layer is in contact with the lateral surface of the semiconductor pattern.

10. The semiconductor device of claim 1, wherein the semiconductor pattern has a thickness in a range from about 500 Å to about 700 Å.

11. The semiconductor device of claim 1, wherein the gate structure further includes:

a conductive pattern, a gate pattern, a metal-containing pattern, and a capping pattern which are sequentially stacked on the gate insulating pattern.

12. A semiconductor device comprising:

a semiconductor substrate including a fin part defined by an isolation layer;

a gate structure on the fin part; and a silicon-germanium (SiGe) pattern interposed between the fin part and the gate structure, wherein the silicon-germanium (SiGe) pattern includes:

a pair of dopant regions; and a pair of contacts making contact with the pair of dopant regions, respectively, wherein the silicon-germanium (SiGe) pattern includes a recessed part at an upper portion of the silicon-germanium (SiGe) pattern, wherein a portion of the gate structure fills the recessed part, wherein the dopant regions are disposed at an upper portion of the silicon-germanium (SiGe) pattern, wherein the pair of contacts are spaced apart from the semiconductor substrate, wherein the gate structure includes a gate insulating pattern disposed in the recessed part and extending out of the recessed part onto a top surface of the silicon-germanium (SiGe) pattern, and wherein a top surface of the gate insulating pattern is positioned higher than a top surface of the isolation layer.

13. The semiconductor device of claim 12, wherein the pair of dopant regions are spaced apart from the semiconductor substrate.

14. The semiconductor device of claim 12, wherein the isolation layer is based on a silicon oxide or a silicon nitride.

15. The semiconductor device of claim 12, wherein each of the pair of contacts includes a through plug and a contact pad, and wherein the contact pad is connected to the through plug, and interposed between the top surface and a bottom surface of the silicon-germanium (SiGe) pattern.

16. The semiconductor device of claim 15, wherein the contact pad includes silicide.

17. The semiconductor device of claim 12, wherein the silicon-germanium (SiGe) pattern has a thickness in a range from about 500 Å to about 700 Å.

18. A semiconductor device comprising:

a semiconductor substrate including cell active patterns on a cell region, and a peripheral active region, which is defined by an isolation layer, on a peripheral region adjacent to of the cell region;

word lines (WL) crossing the cell active patterns, in the semiconductor substrate;

bit lines (BL) crossing the word lines, on the semiconductor substrate;

a bit line contact connected to each of the bit lines, at a central portion of each cell active pattern;

a storage node contact on opposite end portions of each of the cell active patterns;

a landing pad on the storage node contact;

a capacitor on the landing pad;

a gate structure on the semiconductor substrate; and a peripheral active pattern disposed between the semiconductor substrate and the gate structure, wherein the peripheral active pattern includes a pair of dopant regions, wherein a pair of contacts connected to the pair of dopant regions, respectively, wherein the pair of contacts includes a through plug and a contact pad, wherein the peripheral active pattern includes a recessed part at an upper portion of the peripheral active pattern, wherein a portion of the gate structure fills the recessed part, wherein the dopant regions are disposed at an upper portion of the peripheral active pattern, wherein the pair of contacts are spaced apart from the semiconductor substrate, wherein the cell active patterns include a first semiconductor material, and wherein the peripheral active pattern includes a second semiconductor material.

19. The semiconductor device of claim 18, wherein the peripheral active pattern has a thickness in a range from about 500 Å to about 700 Å.

20. The semiconductor device of claim 18, wherein the first semiconductor material is Si, and wherein the second semiconductor material is SiGe.

* * * * *